(12) United States Patent
Davidson et al.

(10) Patent No.: US 7,888,966 B1
(45) Date of Patent: Feb. 15, 2011

(54) ENHANCEMENT OF INPUT/OUTPUT FOR NON SOURCE-SYNCHRONOUS INTERFACES

(75) Inventors: Matthew Davidson, Mountain View, CA (US); Ralph Heron, Morgan Hill, CA (US); Lakhdar Iguelmamene, San Jose, CA (US); Rony Tal, Los Altos, CA (US); Asher Druck, Nahariya (IL)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/731,504

(22) Filed: Mar. 25, 2010

(51) Int. Cl.
*H03K 19/0175* (2006.01)
*H03K 19/00* (2006.01)

(52) U.S. Cl. .............................. 326/62; 326/80; 326/93; 365/233.13; 711/100

(58) Field of Classification Search .................... 326/62, 326/63, 68, 80–83, 86, 87, 93; 327/333; 365/233.13; 711/100
See application file for complete search history.

(56) References Cited

U.S. PATENT DOCUMENTS

| | | | |
|---|---|---|---|
| 7,039,146 B2 | 5/2006 | Chiu | |
| 7,385,861 B1 * | 6/2008 | Zhu | 365/194 |
| 7,486,702 B1 | 2/2009 | Yang | |
| 2007/0058478 A1 * | 3/2007 | Murayama | 365/233 |
| 2008/0034134 A1 * | 2/2008 | Kumar | 710/61 |
| 2008/0043552 A1 * | 2/2008 | Ishikawa et al. | 365/201 |
| 2008/0297207 A1 * | 12/2008 | Huang et al. | 327/107 |

* cited by examiner

*Primary Examiner*—Rexford N Barnie
*Assistant Examiner*—Jany Tran
(74) *Attorney, Agent, or Firm*—Davis Wright Tremaine LLP

(57) ABSTRACT

An interface for use of device whose core circuitry operates in one voltage domain, but exchanges signal with another device (or "host") according a different voltage domain, and the use of such an interface for supplying data using a double data rate (DDR) transfer, is presented. One concrete example of this situation is a memory card, where the internal circuitry uses one voltage range for its core operating voltages, but exchanges signals with a host using different, input/output voltage range. According to a general set of aspects, the interface receives data signals from the device at the device's core operating voltage domain, individually level shifts these to the input/output voltage domain, and then combines them into a DDR signal for transfer to the host device, where a (non-level shifted) clock signal from the host device is used as the select signal to form the DDR data signal.

12 Claims, 6 Drawing Sheets

ENHANCEMENT OF INPUT/OUTPUT FOR NON SOURCE-SYNCHRONOUS INTERFACES

FIELD OF THE INVENTION

This invention pertains generally to the field of electrical interfaces and, more particularly, to the output of data for non source-synchronous interfaces.

BACKGROUND

A simple interface for the purpose of data transfer between integrated circuit devices will often include a clock signal provided by the host device which is used by the slave device to output data to the host. A specific example is a read cycle of a memory card or other memory device by a host. The timing of the data output from the slave is then dependent on the arrival of the clock signal. There is an ongoing process to increase of performance of such devices. When higher transfer speeds are desired, one approach is to migrate an interface protocol to a source-synchronous scheme where the both the clock and data signals are provided from the same device, such as in a DDR (Double Data Rate) arrangement used in DRAM devices. However, this approach may not be practical to use in many devices as it may incur substantial changes to the interface (e.g. addition of signal pins). Consequently, there is room for improvements in such interfaces.

SUMMARY OF THE INVENTION

According to a first set of aspects, an interface circuit is presented. The interface circuit is for a first device to electronically connect with a second device, where electronic signals transferred between the first and second devices are of a first voltage range and the core operating voltage of the first device is of a different, second range. The interface circuit includes multiple input/output cells, each of which has a pad for the transfer of signals between the first and second device and each of which has one or more level shifting circuits to convert signals between the first and second voltage ranges. The input/output cells include a first input/output cell, by which the first device receives via the respective pad a clock signal of the first voltage range from the second device when operatively connected to the second device for the transfer of data thereto, level shifts the clock signal to the second voltage range, and supplies the level shifted clock signal to core processing circuitry of the first device. The input/output cells also include one or more second input/output cells, each connected to receive a corresponding pair of first and second data signals of the second voltage range from the core processing circuitry of the first device, level shift the pair of data signals to the first voltage range, and supply the level shifted data signals to the second device when operatively connected to the host. Each second input/output cell includes a multiplexing circuit connected to receive the corresponding pair of level shifted data signals and connected to the first input/output cell to receive the non-level shifted clock signal from it. The multiplexing circuit generates a double data rate signal formed from the combined corresponding pair of level shifted data signals using the clock signal as a select signal, the multiplexing circuit further connected to supply the double data rate signal to the output pad of the second input/output cell.

According to other aspects, a method is presented for the transfer of data from a first device to a second device to which it is electrically connected, where the electrical signals transferred between the first and second device are of a first voltage range and the core operating voltage on the first device is of a different, second voltage range. The method includes receiving from the second device a clock signal of the first voltage range at a first input/output pad of an interface circuit for the first device. The clock signal is provided to a multiplexing circuit on the interface circuit. The method further includes converting the clock signal to the second voltage range on the interface circuit and providing the converted clock signal to logic circuitry of the first device; receiving at the interface a first and a second data signals of the second voltage range, the first and second data signals being transmitted from the logic circuitry clocked by the converted clock signal; converting the first and second data signals to the second voltage range on the interface circuit; and combining the converted first and second data into a double data rate data signal by the multiplexing circuit using the clock signal at the first voltage range as a select signal. The double data rate data signal is then provided to the second device from a second input/output pad on the interface circuit.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following presents an interface, and corresponding techniques, for use of device whose core circuitry operates in one voltage domain, but exchanges signal with another device (or "host") according a different voltage domain; and the use of such an interface for supplying data using a double data rate (DDR) transfer. A concrete example of this situation is a memory card, where the internal circuitry uses one voltage range for its core operating voltages, but exchanges signals with a host using different, input/output voltage range. According to a general set of aspects presented below, the interface receives data signals from the device at the device's core operating voltage domain, individually level shifts these to the input/output voltage domain, and then combines them into a DDR signal for transfer to the host device, where a (non-level shifted) clock signal from the host device is used as the select signal to form the DDR data signal.

As discussed in the Background section, one way to obtain higher transfer speeds is to migrate an interface protocol to a source-synchronous scheme where the both the clock and data signals are provided from the same device, such as the DDR arrangement found in DRAM devices. For existing removable or embedded form factor devices, such SD or MMC cards, this could incur substantial changes to the interface, such as addition of signal pins, other techniques have had to be used to increase interface data transfer rates from prior versions of the protocol. The following addresses these challenges for the design of the device side ASIC.

Although the following discussion is mainly given in the context of a non-volatile memory card type of application, where the interface circuit is formed onto the card's controller, the techniques and circuitry presented are not limited to just these embodiments. More generally, in addition to detachable memory cards, the interface presented here can also be used on other memory devices, such embedded memory devices or SSDs, or even more general situation requiring an interface for the transfer of data. The generic situation is for a first device that operates in a first voltage domain, but exchanges signal with a second device using signals of a second voltage domain. (The second device will be referred to as the "host", as this is what it will correspond to in the exemplary embodiment.) The interface shifts the level of the signals between the two domains and, specifically, receives a clock signal from the host for use by the first device when transferring data to the host. Further, although the interface will typically be formed as part of the first device (such as part of the memory controller, for example), it possible to produce only the interface (or IO cell) as separate part.

Figure 1:
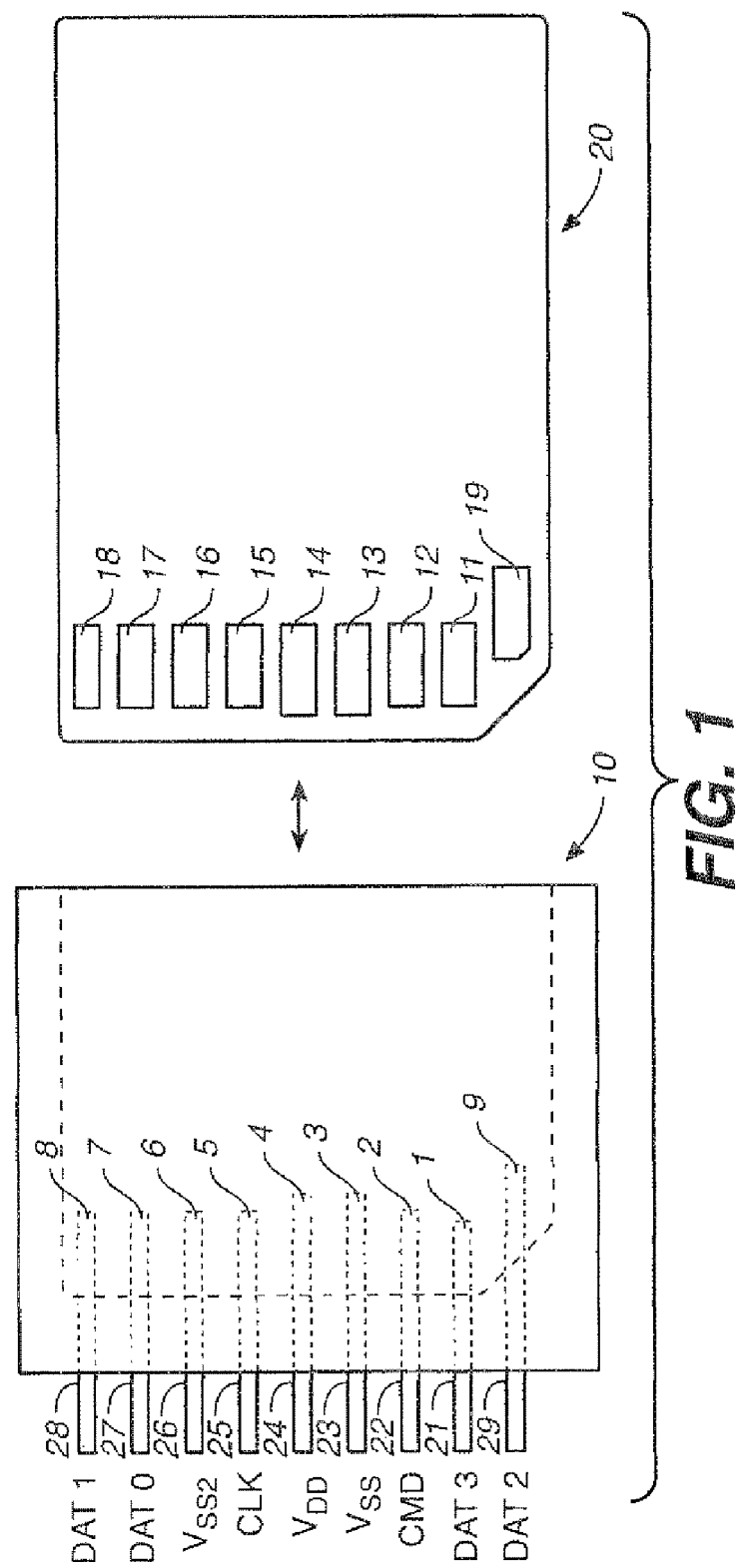
FIG. 1 shows a card according to the SD standard, its contacts, a host slot, and the contact assignments.

As noted, to make the discussion more concrete, the discussion can be placed in the context of an SD memory card. FIG. 1 shows an SD card 20 with external contacts 11-19. This card then attaches to the host (or adapter) in the slot 10 having a corresponding set of contacts 1-9, which then are connected on the internal structure of the host by the pins 21-29. The assignment of the contacts according to the SD standard is also shown. These include the host clock signal at contact 25 and the data input/output contacts 1 and 7-9. Similar arrangements apply to other standards, such as MMC, microSD, compact flash, USB flash drives, memory stick, and so on, with the appropriate changes in pin structures and assignments. The signals exchanged between the host 10 and card 20 use a voltage range that will be called the IO voltage domain. The internal circuitry of the card 20 will typically operate in another voltage range, here called the core voltage domain, and the host interface circuitry of the card will translate between these voltage domains.

Figure 2:
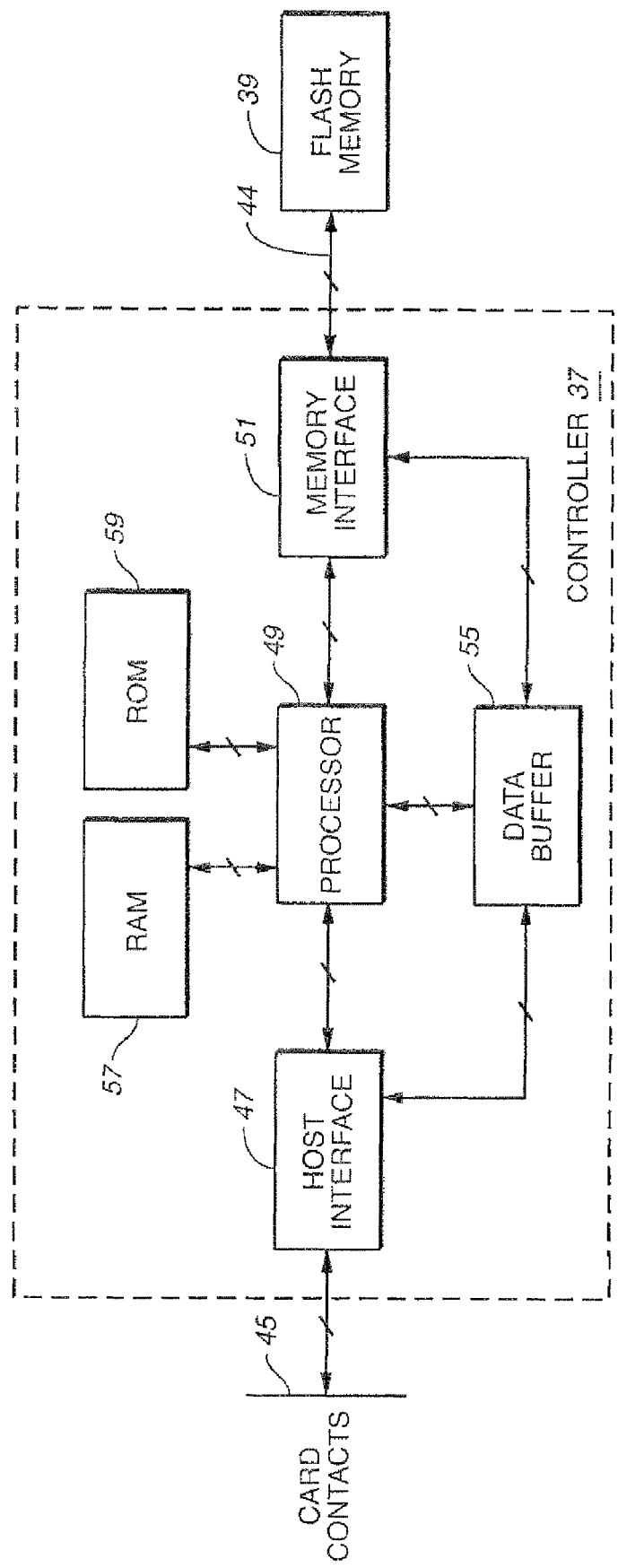
FIG. 2 is a block diagram of a memory card.

FIG. 2 is a block diagram of some of the internal elements typically found in an SD card or other flash memory device. One or more flash memory devices 39 and connected along bus structure 44 to the controller circuit 37 through memory interface 51. The controller also includes the processor 49, data buffer 55, RAM 57 and ROM 59. These elements operate in the core voltage domain. The host interface is shown at 47 and will include the IO cells discussed below with respect to FIGS. 3-6. The card contacts 45 correspond to the contacts 11-19 of FIG. 1 and are connected to pads on the IO cells of interface 47. More detail on memory systems is described in, for example, U.S. Pat. Nos. 5,070,032, 5,095,344, 5,315,541, 5,343,063, and 5,661,053, 5,313,421; 5,570,315, 5,903,495, 6,046,935; and 6,222,762, and U.S. patent application Ser. No. 12/642,649, filed on Dec. 18, 2009, as well as the various references further cited in these. More detail on memory cards where such is described in, for example, U.S. Pat. Nos. 5,887,145; 6,820,148; 7,305,535; 7,360,003; and 7,364,090 and U.S. patent application Ser. No. 12/676,339.

Figure 3:
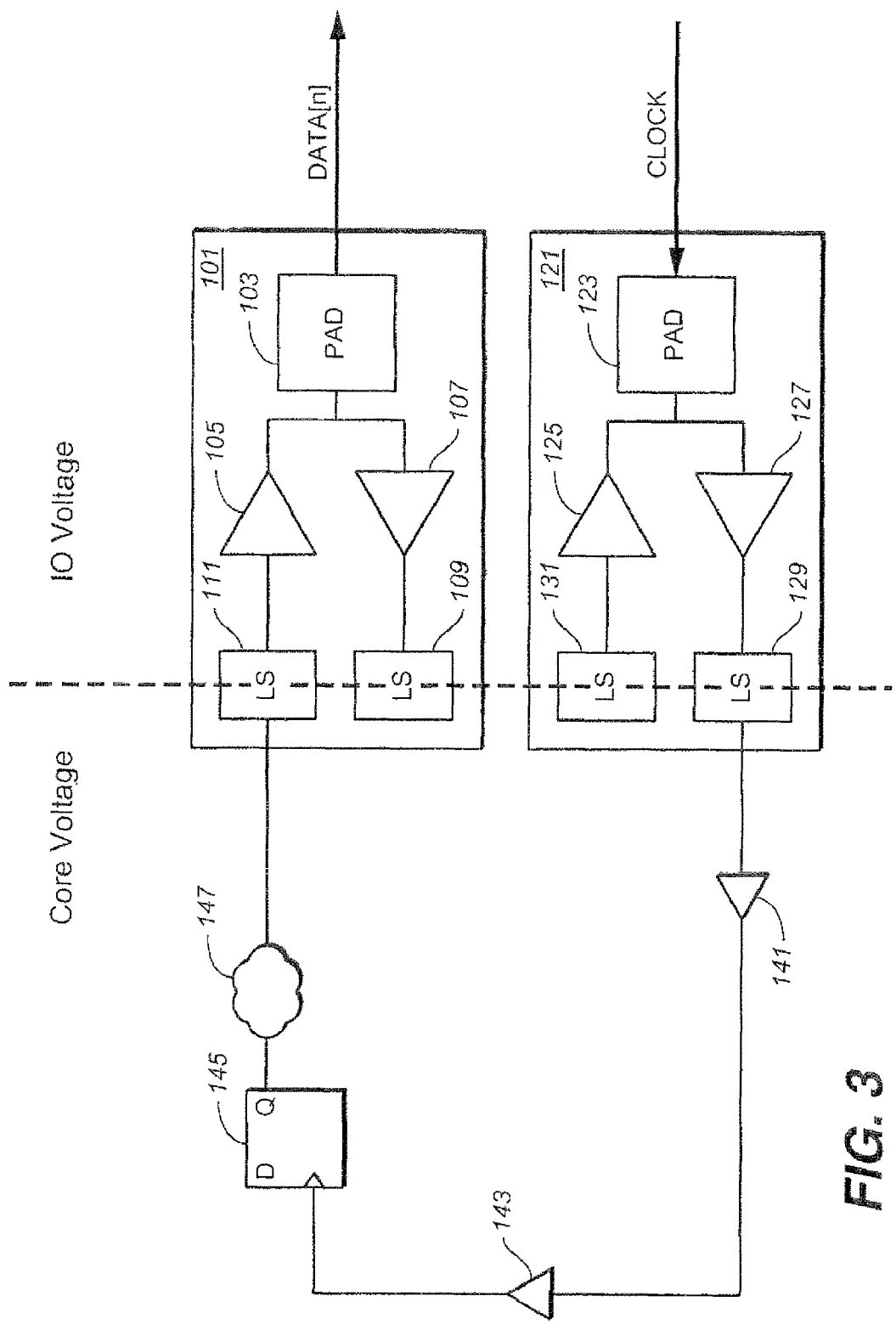
FIG. 3 illustrates a single data rate interface.

Within the host interface 47, the use of level shifters is typically required as the IO voltage may vary (e.g. 1.8V and 3.3V) for the same interface protocol, as in SD UHS. Furthermore, the core logic on modern processes (0.13 um and below) will run at lower voltages (e.g. 1.2V or 1.0V) than the interfaces. In an SDR (single data rate) interface, where one bit of data is typically transferred for each data pin per clock cycle (e.g., 4-bits for SD cards, 8-bits for MMC, etc.), the topology of FIG. 3 is typical. The interface will include a number of input/output cells corresponding the devices input/output pins or contacts, each having a pad that will be connected to the corresponding contact. FIG. 3 shows two of these IO cells, 101 and 103, respectively corresponding to one of the data pins and the pin for the host's clock signal. Each IO cell will usually have a level shifting circuit (109, 111, 129, 131) for each of input and output functions connected to the pads by respective drives (105, 107, 125, 127). The other IO cells are not shown and, aside from the drivers, the other elements of the cells are not shown to simply the discussion, with only the IO cell 121 receiving the clock signal and one of data IO cells 101 being explicitly shown. The core circuitry on the device is also simplified to the relevant elements of the flip-flop 145 and the drivers 141 and 143, with the other elements represented by the cloud 147.

In a SDR data transfer from the device to the host, the clock signal is received from the host at the pad 123 and transferred through driver 127 to the level shifter 129, where it is shifted from the IO voltage range to the core voltage domain. The level shifted clock is then transferred to the flip-flop 145 by the drivers 141 and 143. The critical path includes the flip-flop 145 containing the data to be output to the host device, which after traversing the other circuit elements (represented by 147) is supplied to cell 101. The data is then level shifted to the IO voltage domain by level shifter 111 and sent by the driver 105 to the pad 103, where it can be output to the host.

Figure 4:
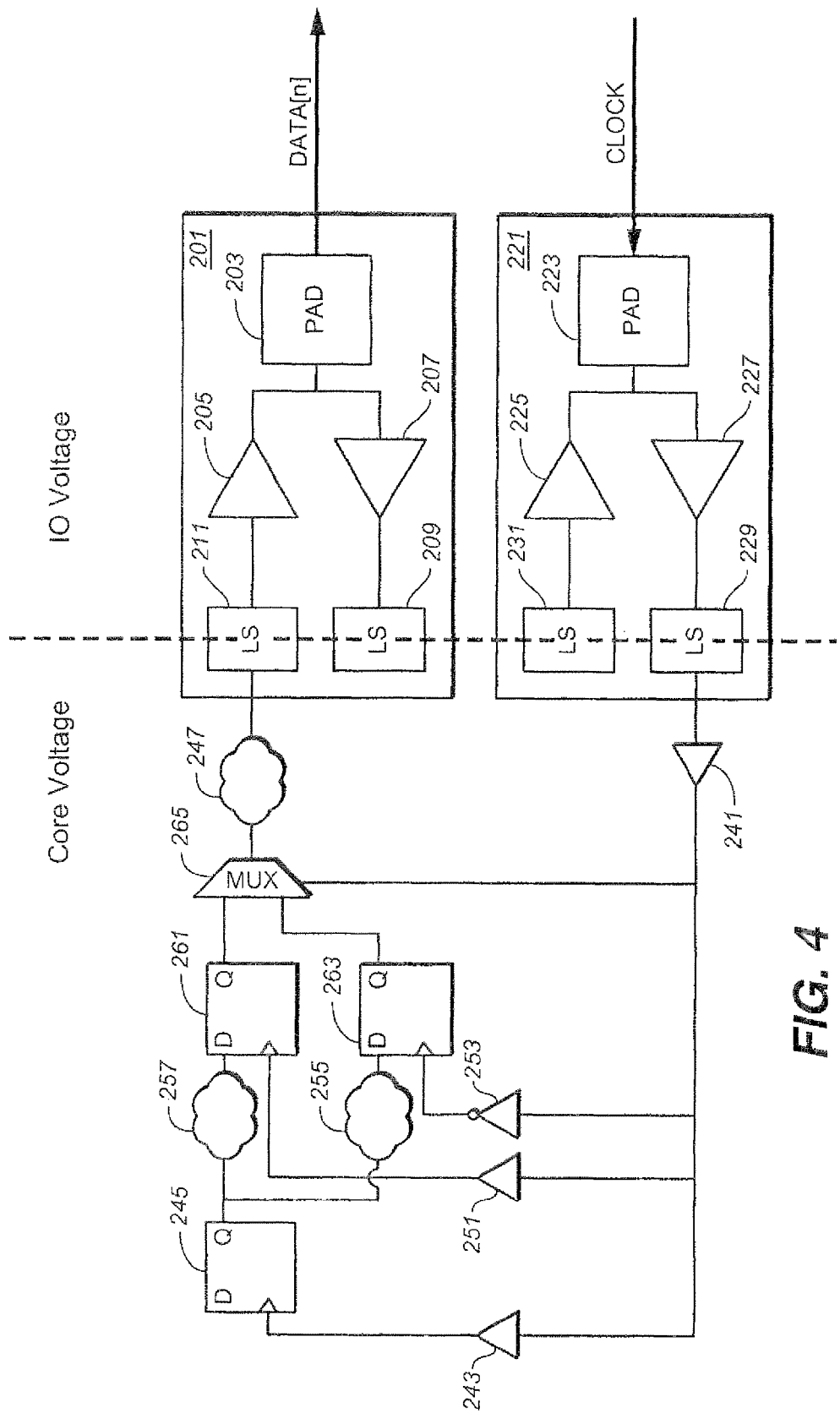
FIG. 4 illustrates a double data rate interface where the double data rate signal is formed before the data signals are level shifted to the input/output voltage domain.

A typical circuit for implementing a DDR interface is shown in FIG. 4, which is simplified similarly to as discussed with respect to FIG. 3. The IO cells 201 and 221 are much the same as the corresponding elements as in FIG. 3, with their components correspondingly numbered. The core circuitry has been changed to form a double data rate signal and supply it to IO 201. The level shifted clock signal is still supplied through the drivers 241 and 243 to flip-flop 245, but flip-flop 245 now feeds the flip-flops 261 and 263, where any intervening circuitry is schematically represented at 253 and 255. The flip-flops 261 and 263 respectively receive the (level shifted) clock signal and inverted clock signal (through driver 251 and driver/inverter 253) and provide (single data rate) data stream to multiplexor 265 that are half a cycled out of phase. The level-shifted clock signal is then used as the select signal by multiplexor 265 to form the combined, double data rate signal that is supplied through any intervening circuitry to the data output IO cell 203.

The critical path of the circuit of FIG. 4 is through the clock receiver IO cell 221, which is then level-shifted from the IO voltage to the core voltage; the clock signal is the used as the select input to a multiplexor 265, whose output is fed to the data transmitter IO cell 201, where the data output is then level-shifted back to the IO voltage and sent to the host device. Consequently the arrangement of FIG. 4, and also that of FIG. 3, may suffer from significant delay internal to the ASIC device, which impacts the overall timing budget of the system. To account for this, it may be possible to increase the drive-strength for the output IO cell, but this will increase the amount of overshoot and undershoot seen by the host device, potentially causing functional failures.

The exemplary embodiment presented here moves the multiplexor logic out of the core logic and into the IO cell itself. Relative to FIG. 4, this scheme removes the delay associated with both the level shifter in the input IO (clock)

and output IO (data). This logic path is also very fast since the IO cells may be located in very close proximity to each other so delays related to signal routing can be more easily minimized, with the signals connectable by abutment.

Figure 5:
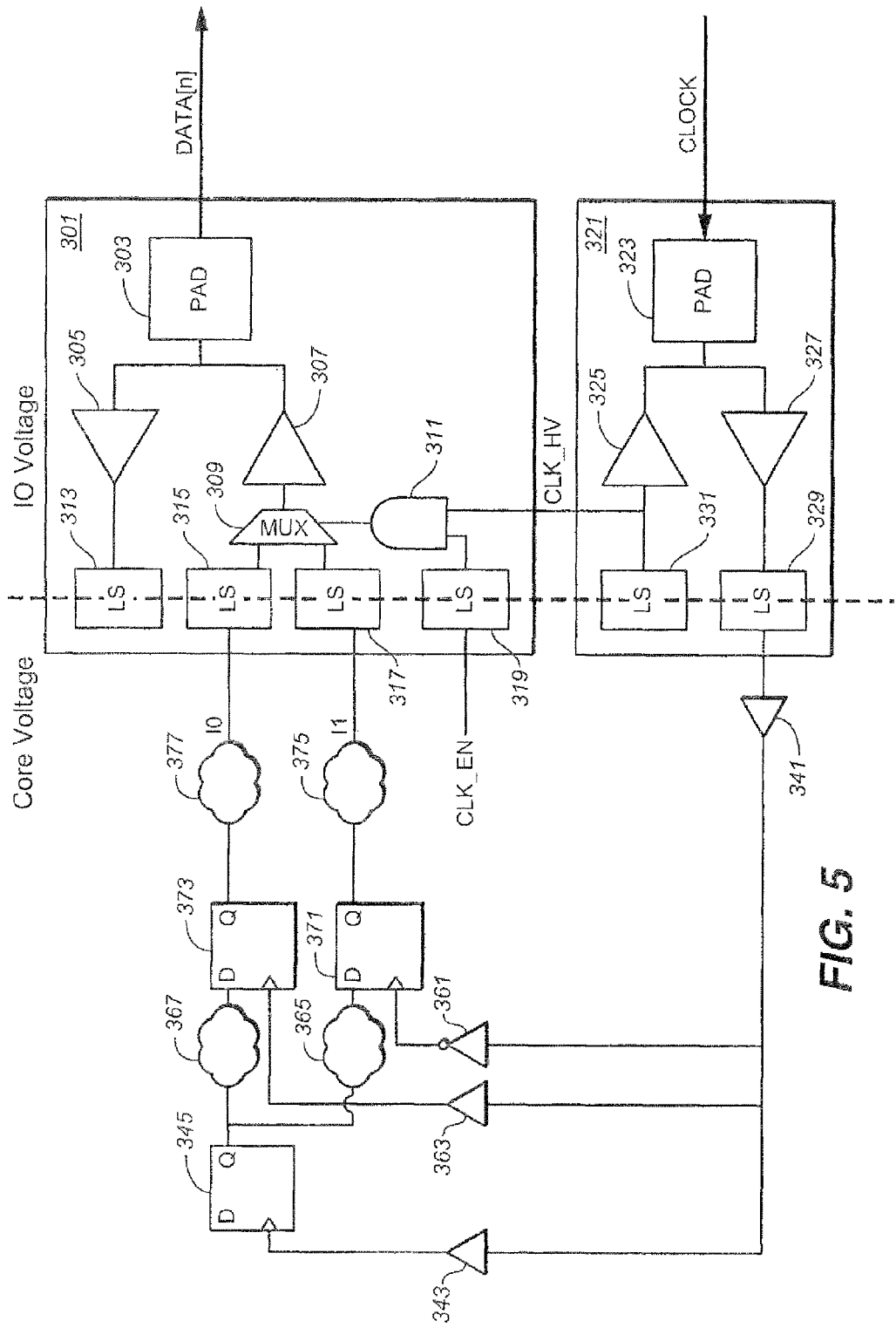
FIG. 5 illustrates a double data rate interface according to an exemplary embodiment.

Referring to FIG. 5, this shows a block diagram of an exemplary embodiment. As before, only the elements particularly relevant to the discussion are shown, with the others being suppressed to simply the presentation. This new circuit consists of a modified DATA IO cell 301. Again, only a single cell is explicitly shown, although an actual device may include several such cells. This cell contains two data inputs, I0 (which represents the data to be output when CLOCK is logic 0) and I1 (which represents the data to be output when CLOCK is logic 1). This is in contrast to the previous, conventional cell 201 of FIG. 4 which only includes a single data input. I0 and I1 are provided by the core logic prior to the change in CLOCK, which is connected to the DATA pad 301 directly with CLK_HV, the CLOCK signal in the IO voltage domain. Therefore, the critical path for this circuit is contained entirely within the IO voltage domain and any delay associated with the core logic or the level shifters is removed. In this embodiment, another signal, CLK_EN, is also provided to disable the switching between I0 and I1 to allow for test modes or other non-DDR IO functions.

Considering FIG. 5 in more detail, the interface receives a clock signal from the host at pad 323 of IO cell 321. The clock signal is then fed through a driver 325 to the level shifter 331 and on to the core logic of the device. IO cell 321 also includes level shifter 329 and driver 327 to allow for output functions. IO cell 321 differs from the corresponding cell 221 of FIG. 4 in that the (non-level shifted) clock signal in the IO voltage range, here labeled CLK_HV to distinguish it from the level shifted clock of the core voltage domain, is supplied to the data IO cells like cell 301. The core logic is again schematically represented similarly to in FIGS. 3 and 4: the level shifted clock signal passes through drivers 341 and 343 to the flip-flop 345, which it turns clocks the various elements represented by the clouds of 367 and 365 that supply their respective data streams to the flip-flops 373 and 371. The flip-flops 373 and 371 are respectively fed the (level shifted) clock signal from driver circuit 363 and, in inverted form, from driver/inverter 361, which then provide the data signals I0 and I1 to the IO cell 301 through any intervening circuitry (represented by the clouds 377, 375). Again, the specifics of the core logic are not of particular importance here, except that the pair of data streams I0 and I1 arrive at the cell 301 still in the core voltage domain. If there are other data output cells, they could similarly be arranged.

IO cell 301 now receives both I0 and I1 and individually level shifts them in level shifters 315 and 317, with I0 and I1 now in the IO voltage domain now supplied to the multiplexor 309. The clock signal CLK_HV is then used by the multiplexor 309 as the select signal to form the DDS data signal that is then supplied through driver 301 to the pad 303. The core logic can also supply a clock enable signal CLK_EN that, after being level shifted in level shifter 319, can be used to disable the switching between I0 and I1 to allow for test modes or other non-DDR IO functions. In this embodiment, this is done by ANDing the level shifted CLK_EN with CLK_HV in the gate 311 before supplying it to the multiplexor 309. Other arrangements for the CLK_EN signal and associated logic could also be used, such as supply this signal to the CLOCK receiving cell 321, moving AND gate 311 or alternate elements to IO cell 321, and so on. (IO cell 301 is also shown with driver 305 and level shifter 313 for data input, but these, as well as other circuit elements not being shown, do not enter into the discussion here.)

Under this arrangement, the critical path for this circuit runs from pad 323, through driver 325 and gate 311 to MUX 309, then through driver 307 to pad 303. Consequently, the critical path is contained entirely within the IO voltage domain. The delay associated with the core logic or the level shifters under the arrangement of FIG. 4 is removed. Also, the logic path will tend to be very fast since the IO cells are typically located in very close proximity to each other, minimizing delays related to signal routing and allowing the (non-level shifted) clock signal to be connected by abutment.

Figure 6:
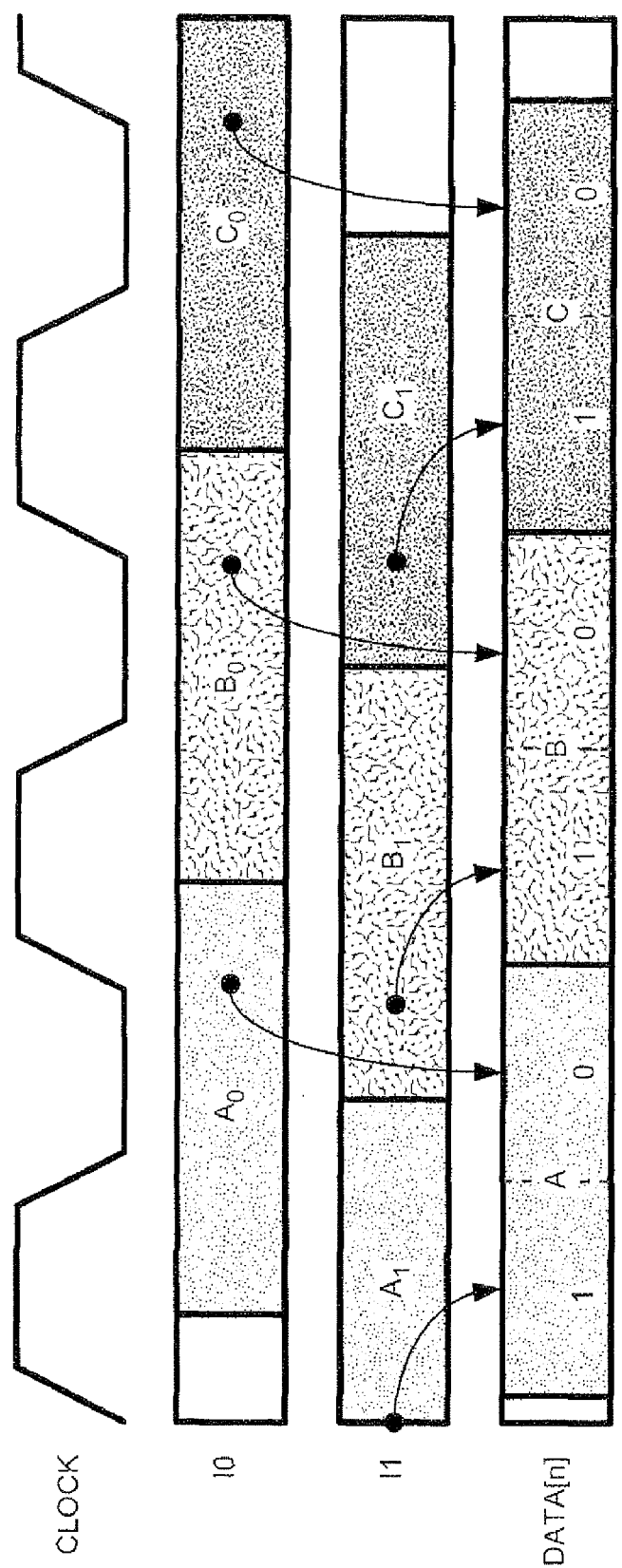
FIG. 6 illustrates how the exemplary embodiment can be used for single data rate operation.

FIG. 6 illustrate the combining of the two single data rate signals into a single double data signal. At top, the clock signal is shown, with the data signal I0 (with data $A_0$, $B_0$, $C_0$, ...) and data signal I1 (with data $A_1$, $B_1$, $C_1$, ...) underneath. As shown, these signal are half a cycle out of phase. Using CLOCK as the select, the DDR signal DATA[n] is formed of the I1 data of the rising edge and of the I0 data on the fall edge. In FIG. 5, this is effected by MUX 309 using the non-level shifted version CLK_HV of the input CLOCK.

Although the exemplary embodiment is for use in DDR interfaces, this scheme can also be used to accelerate single data rate (SDR) interfaces as well. In this "quasi-DDR" scheme, the circuit schematic is the same as for DDR, however the control logic is varied such that the output data is prepared a half clock cycle early, and held in each of the output flip-flops (373 and 371 that respectively connect to the I0 and I1 IO inputs) for a full clock cycle. By doing this, the critical path is reduced to the same single gate and multiplexor (all in the same voltage domain) as in the normal DDR scheme, thereby improving the timing of SDR protocols. CLK_EN to the multiplexor is here set to logic 1 for this quasi-DDR operation, even though it is seen as an SDR protocol from the host side. Note the use of the CLK_EN signal can also allow for full compatibility with non-DDR hosts.

Returning to FIG. 6, the waveforms there can also be used to show an example of a "quasi-DDR" mode using the circuit of FIG. 5. Here, the data is provided for a full clock cycle on both the I0 and I1 IO inputs, which now have equivalent data content, but with the I1 data half a cycle ahead, so that the subscripts can be ignored. (That is, $A_0=A_1$, $B_0=B_1$, and so on.) Although the IO will switch between I0 and I1 in the middle of the cycle, it appears to the host device as standard SDR signaling since the same data is used on both the high and low parts of a given clock cycle.

Consequently, the circuitry and corresponding techniques presented above can reduce the critical timing path for read cycles in non-source-synchronous interface protocols as the internal clock tree (and glue logic) latency is effectively removed from the critical timing path. In non-source synchronous host modes, this additional timing budget can be allocated to the IO propagation delay (an increase in transceiver source impedance) which can serve to improve channel signal integrity performance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. An interface circuit for a first device to electronically connect with a second device, where electronic signals transferred between the first and second devices are of a first voltage range and the core operating voltage of the first device is of a different, second range, the interface circuit comprising:
a plurality of input/output cells, each having a pad for the transfer of signals between the first and second device and each having one or more level shifting circuits to convert signals between the first and second voltage ranges, the plurality of input/output cells including:
a first input/output cell, whereby the first device receives via the respective pad a clock signal of the first voltage range from the second device when operatively connected to the second device for the transfer of data thereto, level shifts the clock signal to the second voltage range, and supplies the level shifted clock signal to core processing circuitry of the first device; and
one or more second input/output cells, each connected to receive a corresponding pair of first and second data signals of the second voltage range from the core processing circuitry of the first device, level shift the pair of data signals to the first voltage range, and supply the level shifted data signals to the second device when operatively connected thereto, wherein each second input/output cell includes:
a multiplexing circuit connected to receive the corresponding pair of level shifted data signals and connected to the first input/output cell to receive the non-level shifted clock signal therefrom, wherein the multiplexing circuit generates a double data rate signal formed from the combined corresponding pair of level shifted data signals using the clock signal as a select signal, the multiplexing circuit further connected to supply the double data rate signal to the output pad of the second input/output cell.

2. The interface circuit of claim 1, wherein the interface circuit is connected to receive a clock enable signal from the first device, wherein the multiplexing circuit generates the double data rate signal when the clock enable signal is asserted.

3. The interface circuit of claim 1, wherein the interface circuit has a plurality of second input/output cells.

4. The interface circuit of claim 1, wherein each of the second input/output cells further includes a driver whereby the multiplexing circuit is connected to supply the double data rate signal to the output pad of the second input/output cell.

5. The interface circuit of claim 1, wherein the first device is a memory controller circuit upon which the interface is formed and the second device is a host.

6. The interface circuit of claim 5, wherein the memory controller circuit is the controller for a memory device enclosed in a housing having a plurality of external electrical contacts to which the pads are connected for electrical communication with the host when detachably connected thereto.

7. The memory device of claim 1, wherein the first and second data signals of one of the pairs of data signals as received from the first device have the same data content skewed by a half a cycle, so that the combined data signals form the equivalent of a single data rate signal.

8. A method of transferring data from a first device to a second device to which it is electrically connected, where the electrical signals transferred between the first and second device are of a first voltage range and the core operating voltage on the first device is of a different, second voltage range, the method comprising:
receiving from the second device a clock signal of the first voltage range at a first input/output pad of an interface circuit for the first device;
providing the clock signal to a multiplexing circuit on the interface circuit;
converting the clock signal to the second voltage range on the interface circuit;
providing the converted clock signal to logic circuitry of the first device;
receiving at the interface a first and a second data signals of the second voltage range, the first and second data signals being transmitted from the logic circuitry clocked by the converted clock signal;
converting the first and second data signals to the second voltage range on the interface circuit;
combining the converted first and second data into a double data rate data signal by the multiplexing circuit using the clock signal at the first voltage range as a select signal; and
providing to the second device the double data rate data signal from a second input/output pad on the interface circuit.

9. The method of claim 8, further comprising:
receiving a clock enable signal from the first device, wherein the multiplexing circuit generates the double data rate signal in response to the clock enable signal being asserted.

10. The method of claim 8, wherein the first device is a memory controller circuit upon which the interface is formed and the second device is a host.

11. The interface circuit of claim 10, wherein the memory controller circuit is the controller for a memory device enclosed in a housing having a plurality of external electrical contacts to which the pads are connected for electrical communication with the host when detachably connected thereto.

12. The method of claim 8, wherein the first and second data signals as received have the same data content skewed by a half a cycle, so that the combined data signals form the equivalent of a single data rate signal.

* * * * *